United States Patent
Kim et al.

(10) Patent No.: US 8,737,554 B2
(45) Date of Patent: May 27, 2014

(54) PULSE-SIGNAL RECOVERING DEVICE WITH TIME-INTERLEAVING SCHEME

(75) Inventors: Seong-Do Kim, Daejeon (KR); Pil Jae Park, Daejeon (KR); Sung Chul Woo, Seoul (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 231 days.

(21) Appl. No.: 13/326,205

(22) Filed: Dec. 14, 2011

(65) Prior Publication Data

US 2012/0148002 A1 Jun. 14, 2012

(30) Foreign Application Priority Data

Dec. 14, 2010 (KR) .................. 10-2010-0127576

(51) Int. Cl.
*H04L 7/00* (2006.01)
(52) U.S. Cl.
USPC .......................................... 375/371
(58) Field of Classification Search
USPC .................. 375/355, 371–373; 370/503, 516
See application file for complete search history.

(56) References Cited

U.S. PATENT DOCUMENTS

| | | | |
|---|---|---|---|
| 7,292,170 B2* | 11/2007 | Kinyua et al. | 341/141 |
| 8,265,112 B2* | 9/2012 | Yoffe et al. | 372/38.02 |
| 2006/0230389 A1* | 10/2006 | Moulckers et al. | 717/127 |
| 2009/0306919 A1* | 12/2009 | Akita et al. | 702/70 |
| 2010/0117880 A1* | 5/2010 | Moore et al. | 341/133 |

FOREIGN PATENT DOCUMENTS

| | | |
|---|---|---|
| KR | 1020050047209 A | 5/2005 |
| KR | 1020090067246 A | 6/2009 |
| KR | 1020100035915 A | 4/2010 |

* cited by examiner

*Primary Examiner* — Khanh C Tran

(57) ABSTRACT

Disclosed is a pulse-signal recovering device with a time-interleaving scheme. Exemplary embodiments of the present invention can improve receive performance of a radar so as to shorten pre-scanning time for roughly determining presence and absence of objects and time consumed to recover received pulse signals in the radar receiver with the sub-sampling scheme by simultaneously sensing signal levels of the received pulse signals at several positions and improve a signal to noise ratio by increasing an averaging rate with respect to the number of same received pulses.

7 Claims, 4 Drawing Sheets

US 8,737,554 B2

PULSE-SIGNAL RECOVERING DEVICE WITH TIME-INTERLEAVING SCHEME

CROSS-REFERENCES TO RELATED APPLICATIONS

The present application claims priority under 35 U.S.C 119(a) to Korean Application No. 10-2010-0127576, filed on Dec. 14, 2010, in the Korean Intellectual Property Office, which is incorporated herein by reference in its entirety set forth in full.

BACKGROUND

Exemplary embodiments of the present invention relate to a pulse-signal recovering device with a time-interleaving scheme, and more particularly, to a pulse-signal recovering device with a time-interleaving scheme and a method thereof capable of improving a signal to noise ratio while shortening time consumed to recover received pulse signals, by simultaneously sensing signal levels of the received pulse signals at several positions by configuring a plurality of track and hold units in parallel in a receiver of a radar with an impulse scheme.

A radar with an impulse scheme for sensing signal levels of pulse signals with a very narrow pulse width is difficult to process received impulse signals using a general over-sampling type ADC since the frequency bandwidth of the impulse signal is very wide. Therefore, most of the radars with the impulse scheme process the received impulse signals using a sub-sampling scheme.

A radar with a sub-sampling scheme samples the received pulse signals using clock signals having a slight time offset in pulse repetition interval (PRI), thereby recovering pulse signals having a wide pulse width.

However, in order to increase receiver performance of the radar with a sub-sampling scheme, the time difference between the received pulse signals and the PRI of a transmitter are to be minimized, but the time consumed to recover the received pulse signals is increased accordingly.

SUMMARY

An object of the present invention is to provide a pulse-signal recovering device with a time-interleaving scheme and a method thereof capable of improving signal to noise ratio while shortening time consumed to recover received pulse signals, by simultaneously sensing signal levels of the received pulse signals at several positions by configuring a plurality of track and hold units in parallel in a receiver of a radar.

An embodiment of the present invention relates to a pulse-signal recovering device, including: a plurality of sampling blocks receiving the same receive signals; a sampling clock generator generating a plurality of sampling clocks that are each input to the plurality of sampling blocks, have the same pulse repetition interval, and have different time delays; and a multiplexer receiving a plurality of sampling signals output from the plurality of sampling blocks to output recover signals of the receive signals.

In one embodiment, the receive signal may be an impulse signal.

In one embodiment, the sampling block may include a track and hold unit.

In one embodiment, the plurality of sampling blocks may be sampling blocks with a sub-sampling scheme.

In one embodiment, the sampling clock generator may include a plurality of delay buffers generating the plurality of sampling clocks that have the same pulse repetition interval.

In one embodiment, the pulse-signal recovering device may further include an analog-digital converter converting an output from the multiplexer into a digital signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Figure 1:
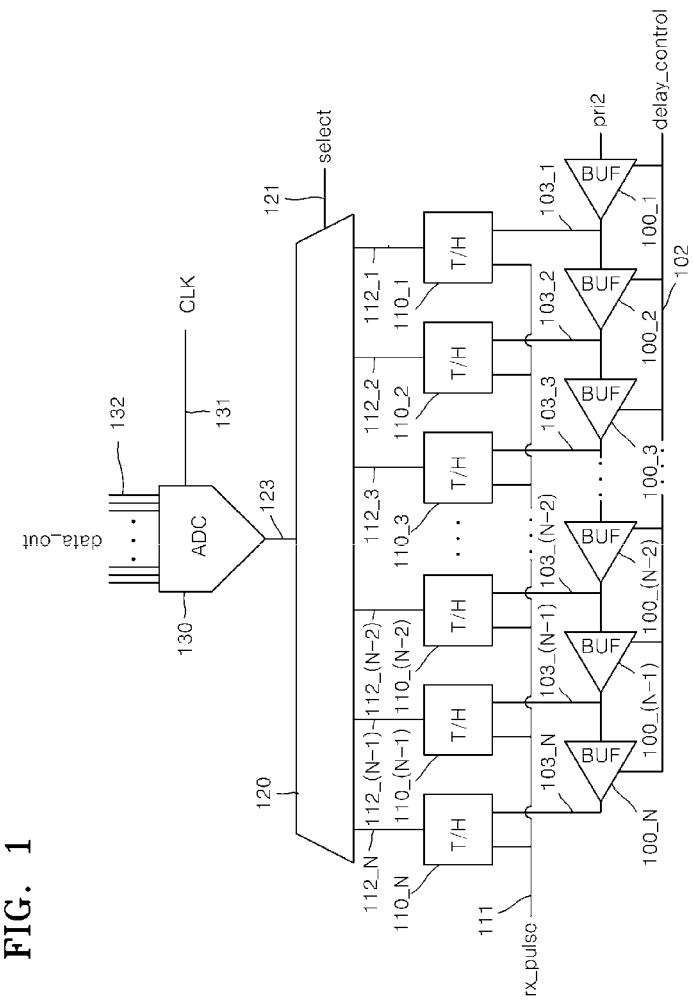
FIG. 1 is a block diagram illustrating a configuration for the pulse-signal recovering device with a time-interleaving scheme in accordance with an exemplary embodiment of the present invention.

Hereinafter, embodiments of the present invention will be described with reference to accompanying drawings. However, the embodiments are for illustrative purposes only and are not intended to limit the scope of the invention.

In describing the embodiment, a thickness of lines illustrated in the drawings, a size of components, etc., may be exaggeratedly illustrated for clearness and convenience of explanation. In addition, terms described to be below are terms defined in consideration of functions in the present invention, which may be changed according to the intention or practice of a user or an operator. Therefore, these terms will be defined based on contents throughout the specification.

FIG. 1 is a block diagram illustrating a configuration for the pulse-signal recovering device with a time-interleaving scheme in accordance with an exemplary embodiment of the present invention.

The pulse-signal recovering device with a time-interleaving scheme in accordance with the exemplary embodiment of the present invention includes a plurality of sampling blocks, a sampling clock generator, and a multiplexor 120.

The sampling clock generator includes an array of buffers 100_1 to 100_N that generate a plurality of signals that delay the signal so as to have a predetermined time difference by using a sampling period (pri2) having a difference by ΔT from a pulse repetition interval (PRI).

The plurality of sampling blocks include an array of track and hold units 110_1 to 110_N that sense levels of received pulse signals by using output signals from the array of buffers 100_1 to 100_N.

The multiplexer 120 uses the output signals from the array of the track and hold units 110_1 to 110_N as an input and selects and outputs one of several input signals by an input select signal 121.

Further, the pulse-signal recovering device may be configured to include an ADC 130 that converts the level of the output signal from the multiplexer 120 into a digital code.

As described above, the buffers 100_1 to 100_N that can vary a delay time are configured in the array form, thereby generating a plurality of clock signals 103_1 to 103_N having the same period as the sampling period pri2 and the delay time of the buffers 100_1 to 100_N.

Therefore, signal levels of received pulse signals rx_pulse 111 may be simultaneously sensed at several positions by using the plurality of clock signals 103_1 to 103_N.

As described above, unlike the recovering device of the radar according to the related art sensing the receive level of one received pulse signal rx_pulse 111 once, the time consumed to recover the one pulse similar to the received pulse may be shortened since the receive levels are simultaneously sensed at several positions by using a plurality of clock signals having a predetermined delay time.

In addition, since the signal levels of the pulses are simultaneously sensed at several positions, an averaging ratio with respect to the number of same receive pulses is more increased than that of the radar of the related art, thereby improving a signal to noise ratio.

Figure 2:
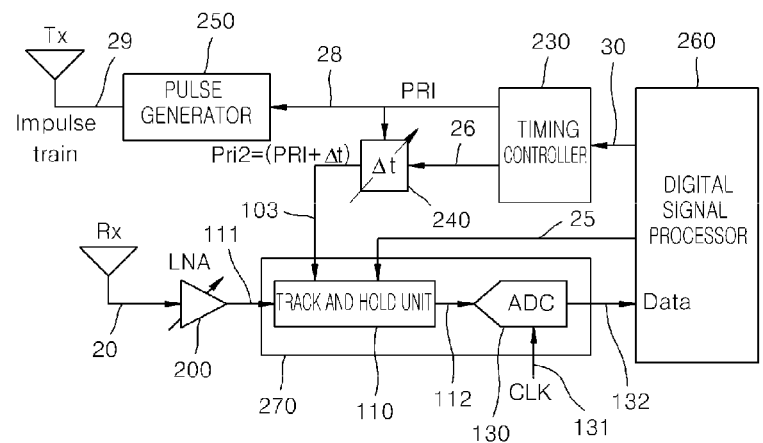
FIG. 2 is a block diagram illustrating a configuration for the radar structure with an impulse scheme using a general impulse signal.

FIG. 2 is a block diagram illustrating a configuration for an example of a radar structure with an impulse scheme using a general impulse signal.

As illustrated in FIG. 2, when transmitting a signal 30 indicating a generation of an impulse train to a timing controller 230 from a digital signal processor 260, the timing controller 230 transmits a pulse train 28 having a pulse repetition interval (PRI) to a pulse generator 250. The pulse generator 250 may generate an impulse train 29 according to a period of the pulse train 28 and output the generated impulse train 29 through a transmit antenna Tx.

A radio wave output through the transmit antenna Tx reaches a targeted object and is then reflected, which may in turn be input to a receive antenna Rx. A low noise amplifier 200 may generate a receive signal 111 by amplifying the impulse signal 20 received by the receive antenna Rx and input the generated receive signal 111 to an analog-digital converting unit 270.

The analog-digital converting unit 270 may be configured to include the track and hold unit 110 and the ADC 130. The track-and-hold unit 110 may be input with the sampling pulse train 103 having a second pulse repetition interval PRI2 and may be controlled by the digital signal processor 260. In this case, the sampling pulse train 103 may be generated by allowing a pulse interval controller 240 to change the pulse interval of the pulse train 28.

The track and hold unit 110 may track the receive signal 111 according to the sampling pulse train 130 and maintain the value thereof. An output signal 112 from the track and hold unit 110 is sampled by the ADC 130 and is converted into a digital signal 132 and the digital signal 132 may be input and processed to the digital signal processor 260. The ADC 130 may be operated according to a sampling clock 131.

Figure 3A:
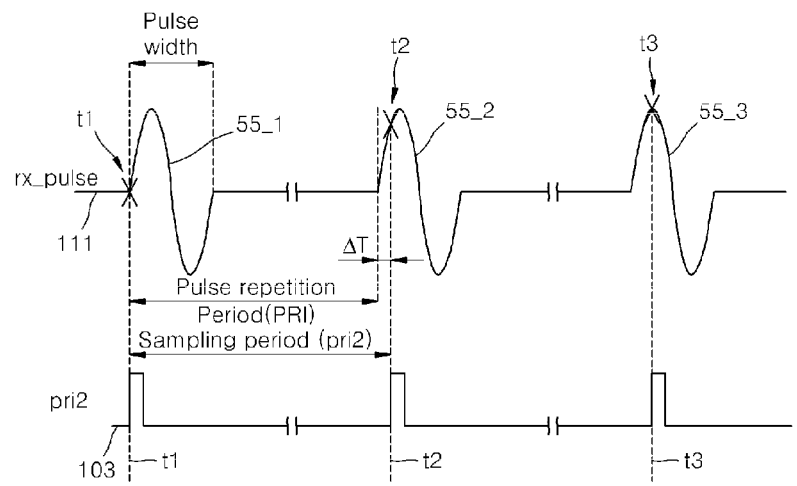
FIGS. 3A to 3C are timing diagrams for describing a method for a radar to recover receive signals.
Figure 3B:
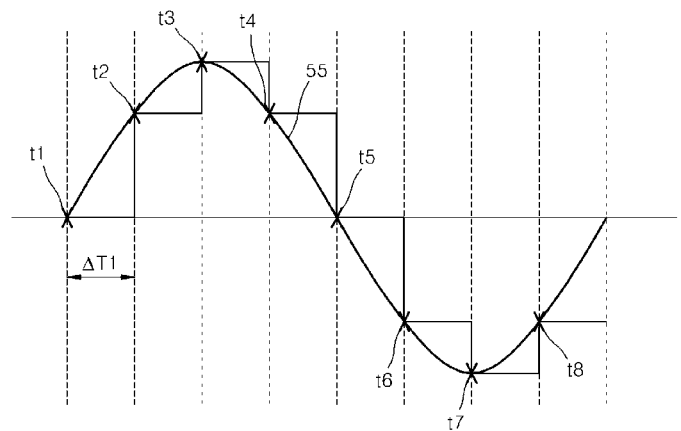
Figure 3C:
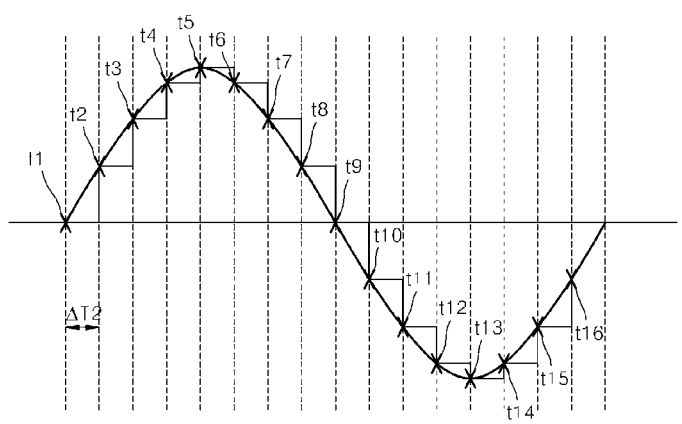

FIGS. 3A to 3C are timing diagrams for describing a method for the radar of FIG. 2 to recover the receive signals.

Referring to FIG. 3A, the receive signal 111 has the pulse signal repetition period PRI and the sample pulse trains 103 has the sampling period pri2. In an example of FIGS. 3A to 3C, the sampling period pri2 is larger by ΔT than the pulse repetition interval PRI. The receive signal 111 may be sampled at a rising-edge of the sampling pulse train 103. The sampling process may be performed by the track and hold unit 110 and the ADC 130 described with reference to FIG. 2. The value of the receive signal 111 may be sampled at time t1, t2, and t3. It can be appreciated that the sampling period pri2 has a difference by ΔT from the pulse repetition interval PRI and thus, values at various phases of analog waveforms 55_1, 55_2, and 55_3 having the same shape may be sampled. In FIG. 3A, ΔT is set to be ⅛ of a duration of the analog waveforms 55_1, 55_2, and 55_3 of the receive signal 111.

Therefore, when sampling pulse train 103 is repeated 8 times, the shape of the analog waveforms 55_1, 55_2, and 55_3 of the receive signal may be estimated.

FIG. 3B illustrates that the sampling signal of FIG. 3A is reconfigured. The reconfiguration may be performed in the digital signal processor 260 of FIG. 2. The analog waveforms 55_1, 55_2, and 55_3 are sampled by an interval called ΔT1. As the interval of ΔT1 is narrow, the shape of the analog waveforms 55_1, 55_2, and 55_3 may be more finely recovered. However, as the interval of ΔT1 is narrow, more samples are required so as to recover the shape of the analog waveforms 55_1, 55_2, and 55_3 of the receive signal 111. As a result, the time consumed to recover the analog waveforms becomes longer.

FIG. 3C illustrates a case in which the sampling period prig has a difference by ΔT2 from the pulse repetition interval PRI (ΔT2<ΔT1). For example, when LT2 is set to be ¹⁄₁₆ of a duration of the analog waveforms 55_1, 55_2, and 55_3, the sampling is performed 16 times so as to recover the analog waveforms 5_1, 55_2, and 55_3. In this case, the shape of the analog waveforms 55_1, 55_2, and 55_3 may be more finely recovered than FIG. 3B.

FIGS. 4A to 4F are timing diagrams for describing the pulse-signal recovering method with the time-interleaving scheme in accordance with the exemplary embodiment of the present invention.

Figure 4:
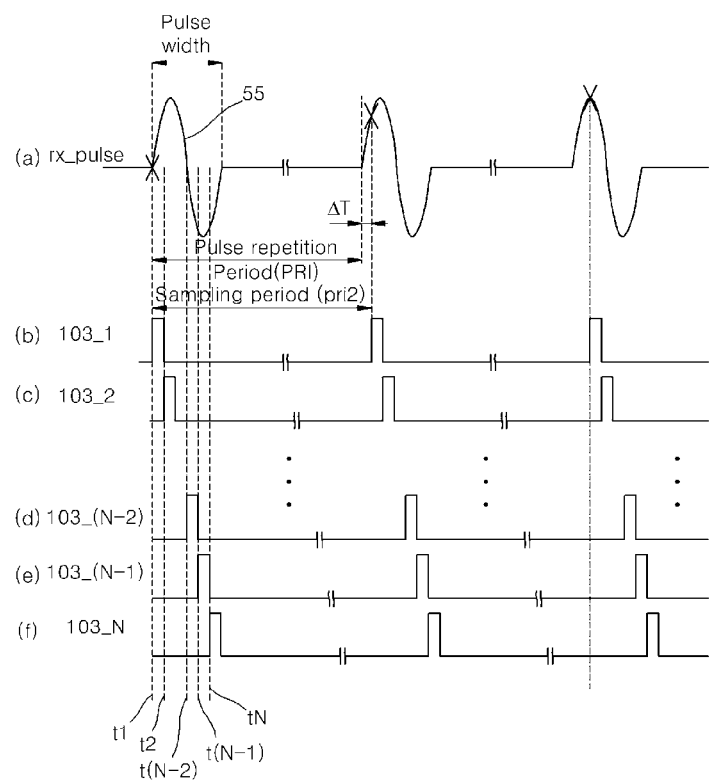
FIGS. 4A to 4F are timing diagrams for describing an operation state of the pulse-signal recovering device with the time-interleaving scheme in accordance with the exemplary embodiment of the present invention.

FIGS. 4A and B each are the same as FIGS. 3A and 3B.

Waveforms illustrated in FIGS. 4C to 4F correspond to a second pulse train 103_2, a (N−2)-th pulse train 103_(N−2), a (N−1)-th pulse train 103_(N−1), and an N−th pulse train 103_N that delays a first pulse train 103_1 illustrated in FIG. 4B by a predetermined time.

In accordance with the embodiment of the present invention, a k-th pulse train 103_k (however, k is a natural number of N or less) may be generated using k buffers 100_1 to 100_k illustrated in FIG. 1.

In FIGS. 4A to 4F, provided that N=8 and ΔT is set to be ⅛ of a duration D of the analog waveform 55, it can be appreciated that one analog waveform 55 may be detected within a repetition period of the receive signal 111.

In FIGS. 4A to 4F, the k-th pulse train and the (k+1)-th pulse train (however, k is a natural number of N−1 or less) may have the same time delay regardless of the k value but may have different time delays according to the k value.

As described above, since the embodiment of the present invention simultaneously senses the signal levels of the received pulse signals at several positions, the pre-scanning time for roughly determining presence and absence of objects and the time consumed to recover the received pulse signals in the radar receiver with the sub-sampling scheme can be shortened and the signal-to-noise ratio of the receive signal can be improved under the conditions of the number of same receive pulses, as compared with the general technology.

In addition, the receiver of the general radar with the impulse scheme is configured to include the single track and hold unit and the single analog-digital converter (ADC), such that as the sub-sampling interval is fine, the time consumed to recover the received pulse signal is increased. However, the recovering device in accordance with the embodiment of the present invention is configured to simultaneously sense the signal levels of the simultaneously received pulse signals at several positions by disposing the plurality of track and hold units in parallel, thereby shortening the time to recover the pulse signals and improving the signal-to-noise ratio by increasing by increasing the averaging ratio with respect to the number of same received pulses.

As set forth above, the exemplary embodiments of the present invention can improve the receive performance of the radar so as to shorten the pre-scanning time for roughly determining presence and absence of objects and the time consumed to recover the received pulse signals in the radar receiver with the sub-sampling scheme by simultaneously sensing the signal levels of the received pulse signals at several positions and improve the signal to noise ratio by increasing the averaging rate with respect to the number of same received pulses.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A pulse-signal recovering device, comprising:
   a plurality of sampling blocks configured to sample a received signal and to output a plurality of sampled signals;
   a sampling clock generator configured to generate a plurality of sampling clocks that have a same pulse repetition interval and have different time delays, the plurality of sampling clocks being input to corresponding sampling blocks, respectively, at different times; and
   a multiplexer configured to receive the plurality of sampled signals and to output a recovered signal corresponding to the received signal,
   wherein the received signal is detected at the different times determined by the plurality of sampling clocks.

2. The pulse-signal recovering device of claim 1, wherein the received signal is an impulse signal.

3. The pulse-signal recovering device of claim 1, wherein each of the sampling blocks includes a track and hold unit (T/H).

4. The pulse-signal recovering device of claim 1, wherein the plurality of sampling blocks are sampling blocks with a sub-sampling scheme.

5. The pulse-signal recovering device of claim 1, wherein the sampling clock generator includes a plurality of delay buffers configured to generate the plurality of sampling clocks.

6. The pulse-signal recovering device of claim 1, further comprising an analog-digital converter configured to convert the recovered signal into a digital signal.

7. A pulse-signal recovering device, comprising:
   a plurality of sampling blocks configured to receive same receive signals;
   a sampling clock generator configured to generate a plurality of sampling clocks each of which is input to a corresponding sampling block of the plurality of sampling blocks, the plurality of sampling clocks having the same pulse repetition interval and having different time delays;
   a multiplexer configured to multiplex a plurality of sampling signals output from the plurality of sampling blocks and output recover signals corresponding to the receive signals; and
   an analog-digital converter configured to convert an output signal of the multiplexer into a digital signal.

* * * * *